United States Patent
Ishikawa et al.

(10) Patent No.: US 8,253,011 B2
(45) Date of Patent: Aug. 28, 2012

(54) SEMICONDUCTOR SUBSTRATE, ELECTRODE FORMING METHOD, AND SOLAR CELL FABRICATING METHOD

(75) Inventors: Naoki Ishikawa, Annaka (JP); Satoyuki Ojima, Annaka (JP); Hiroyuki Ohtsuka, Annaka (JP); Takenori Watabe, Annaka (JP); Shigenori Saisu, Annaka (JP); Toyohiro Ueguri, Annaka (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 614 days.

(21) Appl. No.: 12/309,923

(22) PCT Filed: Aug. 2, 2007

(86) PCT No.: PCT/JP2007/065127
§ 371 (c)(1),
(2), (4) Date: Feb. 3, 2009

(87) PCT Pub. No.: WO2008/026415
PCT Pub. Date: Mar. 6, 2008

(65) Prior Publication Data
US 2009/0243111 A1 Oct. 1, 2009

(30) Foreign Application Priority Data
Aug. 31, 2006 (JP) .................. 2006-236499

(51) Int. Cl.
 *H01L 31/00* (2006.01)
 *H01B 1/22* (2006.01)
 *C04B 41/51* (2006.01)
(52) U.S. Cl. ............... 136/256; 252/514; 106/1.19
(58) Field of Classification Search .......... 136/256; 252/514; 106/1.19
See application file for complete search history.

(56) References Cited

U.S. PATENT DOCUMENTS
5,198,154 A * 3/1993 Yokoyama et al. .......... 252/514
(Continued)

FOREIGN PATENT DOCUMENTS
JP  A-59-167056  9/1984
(Continued)

OTHER PUBLICATIONS

Hoornstra J., "The Importance of Paste Rheology in Improving Fine Line, Thick Film Screen Printing on Front Side Metallization"; 4th European Photovoltaic Solar Energy Conference and Exhibition, Jun. 30-Jul. 4, Barcelona, Spain, 1997.*

(Continued)

*Primary Examiner* — Basia Ridley
*Assistant Examiner* — Devina Pillay
(74) *Attorney, Agent, or Firm* — Oliff & Berridge, PLC (57) ABSTRACT

The present invention is directed to a semiconductor substrate having an electrode formed thereon, the electrode including at least silver and glass frit, the electrode including: a multi-layered structure constituted of a first electrode layer joined directly to the semiconductor substrate, and an upper electrode layer formed of at least one layer and disposed on the first electrode layer; wherein the upper electrode layer is formed by firing a conductive paste having a total silver content of 75 wt % or more and 95 wt % or less, the content of silver particles having an average particle diameter of 4 μm or greater and 8 μm or smaller with respect to the total silver content in the upper electrode layer being higher than that in the first electrode layer. As a consequence, it is possible to form the electrode, which has the high aspect ratio and hardly suffers an inconvenience such as a break, on the semiconductor substrate by a simple method.

2 Claims, 1 Drawing Sheet

U.S. PATENT DOCUMENTS

| | | | | |
|---|---|---|---|---|
| 5,661,041 A | * | 8/1997 | Kano | 438/72 |
| 6,091,019 A | | 7/2000 | Sakata et al. | |
| 2006/0231803 A1 | * | 10/2006 | Wang et al. | 252/500 |
| 2007/0295381 A1 | * | 12/2007 | Fujii et al. | 136/244 |

FOREIGN PATENT DOCUMENTS

| | | |
|---|---|---|
| JP | A-07-085720 | 3/1995 |
| JP | A-10-144943 | 5/1998 |
| JP | A-11-103084 | 4/1999 |
| JP | A-11-312813 | 11/1999 |
| JP | 2000-315421 * | 11/2000 |
| JP | A-2003-133567 | 5/2003 |
| JP | A-2003-257243 | 9/2003 |
| JP | A-2005-353691 | 12/2005 |
| WO | WO2005/093855 A1 * | 6/2005 |

OTHER PUBLICATIONS

JP200-315421, Machine Translation, Matsumoto, Nov. 2000.*

* cited by examiner

SEMICONDUCTOR SUBSTRATE, ELECTRODE FORMING METHOD, AND SOLAR CELL FABRICATING METHOD

TECHNICAL FIELD

The present invention relates to a semiconductor substrate having an electrode formed thereon, and relates to a method for forming an electrode onto a semiconductor substrate, and a method for fabricating a solar cell using it.

BACKGROUND ART

Figure 3:
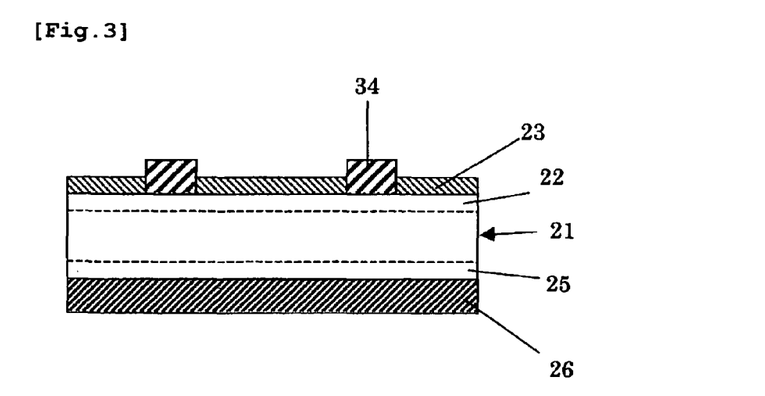
FIG. 3 is a schematic view showing the structure of a solar cell in the conventional art.

FIG. 3 shows the structure of a typical solar cell in the conventional art. In one main surface side of a p-type Si substrate 21 made of single-crystal or polycrystalline Si having a thickness of about 0.25 mm is formed an emitter layer (an $n^+$ layer) 22 having P or the like diffused therein in a depth of 0.1 μm to 0.5 μm, on which are formed an antireflection coating 23 made of $Si_3N_4$ or $SiO_2$ for reducing a surface reflectance and a front surface electrode (i.e., a light-receiving surface electrode) 34 for taking out a current. In the other surface side (i.e., a back surface side) of the Si substrate is formed a BSF layer (a $p^+$ layer) 25 having Al or the like diffused therein at a high concentration. Moreover, a back surface electrode 26 is formed on the back surface.

In fabricating a solar cell of this type, for the reasons of easiness and a low cost, the front surface electrode 34 is generally formed by printing and firing as follows. A conductive paste incorporating silver powder therein is generally used as a material for the front surface electrode. The conductive paste is applied by screen-printing or the like, followed by sintering at a high temperature inside of a firing furnace, thereby forming a front surface electrode. In such an electrode forming method, the conductive paste to be used normally includes mainly the silver powder, glass frit, an organic vehicle, and an organic solvent.

This light-receiving surface electrode needs to have a small occupation area and a low resistance in such a manner as not to shield light, and therefore, is required to be a thick electrode having a fine line width (i.e., a high aspect ratio). However, it is in principle difficult to form an electrode having a high aspect ratio by one printing in the screen-printing method. In view of this, as effective solving measures has been well known a multi-layered electrode structure obtained by printing electrode pastes on a solar cell substrate in superimposition a plurality of times by the screen-printing, thereby achieving a high aspect ratio (see, for example, Japanese Patent Application Laid-open No. H11-103084).

However, when the electrode having the high aspect ratio is formed by simply repeating the screen-printing and drying of the electrode pastes for a solar cell in the conventional art, like the above-described multi-layered electrode structure in the conventional art, there has arisen a problem that contraction of a silver particle during sintering sometimes induces a break, thereby making the electrode inoperative. Moreover, there has arisen problem that foaming, cracking, incomplete combustion of an organic binder contained in the conductive paste of a lower layer (a side of the substrate), or the like occurs during sintering the pastes for a multi-layered electrode, thereby degrading the characteristics of the electrode.

DISCLOSURE OF THE INVENTION

The present invention has been accomplished in view of the above-described problems, and an object of the present invention is to form an electrode, which has a high aspect ratio and hardly suffers an inconvenience such as a break, on a semiconductor substrate by a simple method.

The present invention has been accomplished to solve the above-described problems. The present invention-provides a semiconductor substrate having an electrode formed thereon, the electrode including at least silver and glass frit, the electrode including: a multi-layered structure constituted of a first electrode layer joined directly to the semiconductor substrate, and an upper electrode layer formed of at least one layer and disposed on the first electrode layer; wherein the upper electrode layer is formed by firing a conductive paste having a total silver content of 75 wt % or more and 95 wt % or less, the content of silver particles having an average particle diameter of 4 μm or greater and 8 μm or smaller with respect to the total silver content in the upper electrode layer being higher than that in the first electrode layer.

In the semiconductor substrate having the electrode of the multi-layered structure formed thereon, in which the upper electrode layer is formed by firing the conductive paste having a total silver content of 75 wt % or more and 95 wt % or less, the content of the silver particles having an average particle diameter of 4 μm or greater and 8 μm or smaller with respect to the total silver content in the upper electrode layer being higher than that in the first electrode layer, it is possible to achieve the semiconductor substrate having the electrode which has a high aspect ratio and hardly suffers an inconvenience such as a break due to the contraction of the silver particle. The electrode having the high aspect ratio can exhibit a low resistance in spite of a small area occupied on the semiconductor substrate.

In this case, it is preferable that each of the content of the silver particles having an average particle diameter of 0.5 μm or greater and smaller than 4 μm with respect to the total silver content in the upper electrode layer and the content of the silver particles having an average particle diameter of 4 μm or greater and 8 μm or smaller with respect to the total silver content in the upper electrode layer should be 20 wt % or more and 80 wt % or less. Moreover, it is preferable that the content of the silver particles having an average particle diameter of smaller than 0.5 μm or greater than 8 μm with respect to the total silver content in the upper electrode layer should be 30 wt % or less.

In this manner, when each of the content of the silver particles having an average particle diameter of 0.5 μm or greater and smaller than 4 μm with respect to the total silver content in the upper electrode layer and the content of the silver particles having an average particle diameter of 4 μm or greater and 8 μm or smaller with respect to the total silver content in the upper electrode layer is 20 wt % or more and 80 wt % or less, or when the content of the silver particles having an average particle diameter of smaller than 0.5 μm or greater than 8 μm with respect to the total silver content in the upper electrode layer is 30 wt % or less, it is possible to more reliably suppress the contraction of the silver particle in the electrode while maintaining the high aspect ratio.

Moreover, the above-described semiconductor substrate may comprise a pn junction, wherein the electrode is a front surface electrode, on a side of which an antireflection coating is disposed, and a back surface electrode is formed on a back surface, to thus serve as a solar cell.

The above-described semiconductor substrate serves as the solar cell, in which the front surface electrode (i.e., the light-receiving surface electrode) can have the high aspect ratio and can hardly suffer an inconvenience such as a break due to the contraction of the silver particle. In the above-described solar cell, an area of the light-receiving surface electrode occupied on a light receiving surface can be reduced, thereby taking a large light receiving area, so as to enhance conversion efficiency. In addition, since the electrode has the low resistance, a series resistance can be reduced, thus achieving the solar cell of a high efficiency.

Moreover, the present invention provides a method for forming an electrode having a multi-layered structure on a semiconductor substrate by screen-printing with a conductive paste including at least silver powder, glass frit, an organic vehicle, and an organic solvent, the method including: forming a first electrode layer joined directly to the semiconductor substrate; and forming an upper electrode layer constituted of at least one layer on the first electrode layer; wherein the conductive paste for the upper electrode layer, for forming the upper electrode layer, has a total silver content of 75 wt % or more and 95 wt % or less, and the content of silver particles having an average particle diameter of 4 μm or greater and 8 μm or smaller with respect to the total silver content in the conductive paste for the upper electrode layer is higher than that in the conductive paste for the first electrode layer, for forming the first electrode layer, thus forming the electrode.

In this manner, in the method for forming the electrode having the multi-layered structure, in which the conductive paste for the upper electrode layer has a total silver content of 75 wt % or more and 95 wt % or less, and the content of silver particles having an average particle diameter of 4 μm or greater and 8 μm or smaller with respect to the total silver content in the conductive paste for the upper electrode layer is higher than that in the conductive paste for the first electrode layer, for forming the first electrode layer, thus forming the electrode, it is possible to achieve the electrode having a high aspect ratio and hardly suffering an inconvenience such as a break due to the contraction of the silver particle in a simple manner. The electrode having the high aspect ratio can exhibit a low resistance in spite of a small area occupied on the semiconductor substrate.

In this case, it is preferable that each of the content of the silver particles having an average particle diameter of 0.5 μm or greater and smaller than 4 μm with respect to the total silver content in the conductive paste for the upper electrode layer and the content of the silver particles having an average particle diameter of 4 μm or greater and 8 μm or smaller with respect to the total silver content in the upper electrode layer should be 20 wt % or more and 80 wt % or less. Moreover, it is preferable that the content of the silver particles having an average particle diameter of smaller than 0.5 μm or greater than 8 μm with respect to the total silver content in the conductive paste for the upper electrode layer should be 30 wt % or less.

In this manner, when each of the content of the silver particles having an average particle diameter of 0.5 μm or greater and smaller than 4 μm with respect to the total silver content in the conductive paste for the upper electrode layer and the content of the silver particles having an average particle diameter of 4 μm or greater and 8 μm or smaller with respect to the total silver content in the upper electrode layer is 20 wt % or more and 80 wt % or less, or when the content of the silver particles having an average particle diameter of smaller than 0.5 μm or greater than 8 μm with respect to the total silver content in the conductive paste for the upper electrode layer is 30 wt % or less, it is possible to more reliably form the electrode having the high aspect ratio in which the contraction of the silver particle can be suppressed.

Additionally, it is preferable that the organic vehicle contained in the conductive paste for the first electrode layer should have a decomposition start temperature of higher than 250° C., and the organic vehicle contained in the conductive paste for the upper electrode layer should have a decomposition start temperature of 170° C. or higher and 250° C. or lower.

In this manner, when the organic vehicle contained in the conductive paste for the first electrode layer has a decomposition start temperature of higher than 250° C., and the organic vehicle contained in the conductive paste for the upper electrode layer has a decomposition start temperature of 170° C. or higher and 250° C. or lower, it is possible to suppress occlusion of combustion gas in heating and sintering the paste of the lower layer of the multi-layered electrode, so as to prevent any occurrence of incomplete combustion, foaming, cracking, or the like.

Furthermore, it is preferable that the viscosity of each of the conductive pastes for the first electrode layer and the upper electrode layer should be 80 Pa·s or more and 200 Pa·s or less. Moreover, it is preferable that the conductive paste for the first electrode layer should have a thixotropy (a TI value) of 1.5 or more and 5.0 or less at 5 rpm/50 rpm, and the conductive paste for the upper electrode layer should have a thixotropy (a TI value) of 1.2 or more and 3.5 or less at 5 rpm/50 rpm.

In this manner, when the viscosity of each of the conductive pastes for the first electrode layer and the upper electrode layer is 80 Pa·s or more and 200 Pa·s or less, or when the conductive paste for the first electrode layer has a thixotropy (a TI value) of 1.5 or more and 5.0 or less at 5 rpm/50 rpm, and the conductive paste for the upper electrode layer has a thixotropy (a TI value) of 1.2 or more and 3.5 or less at 5 rpm/50 rpm, it is possible to favorably keep the printability in screen-printing the conductive paste.

In addition, the present invention provides a solar cell fabricating method including: forming an antireflection coating at a front surface of a semiconductor substrate having a pn junction; forming a front surface electrode at the antireflection coating; and forming a back surface electrode on a back surface; wherein at least the front surface electrode is formed by the above-described electrode forming method.

In this manner, in the solar cell fabricating method provided with the front surface electrode forming method in accordance with the above-described electrode forming method, it is possible to fabricate the solar cell provided with the front surface electrode which has the high aspect ratio and hardly suffers an inconvenience such as a break due to the contraction of the silver particle in a simple manner. In the above-described solar cell, an area of the light-receiving surface electrode occupied on a light receiving surface can be reduced, thereby taking a large light receiving area, so as to enhance conversion efficiency. In addition, since the electrode has the low resistance, a series resistance can be reduced, thus achieving the solar cell of a high efficiency.

The semiconductor substrate according to the present invention can be provided with the electrode having the high aspect ratio, in which the inconvenience such as the break can be suppressed.

Moreover, the electrode having the high aspect ratio and favorable current performance can be formed on the semiconductor substrate in the simple manner by the electrode forming method according to the present invention. The simple electrode forming method can reduce a cost. The solar cell of the high efficiency can be fabricated at a low cost by applying the semiconductor substrate and the electrode forming method to the solar cell.

BEST MODES FOR CARRYING OUT THE INVENTION

The present invention will be explained in more detail below.

As described above, in the case where the electrode formed on the semiconductor substrate has a high aspect ratio by simply repeating screen-printing and drying electrode pastes for a solar cell, like the multi-layered electrode structure in the conventional art, the contraction of the silver particle in sintering sometimes induces the break, thereby raising the problem of non-operation of the electrode.

On the problem, the present inventors have earnestly studied an electrode in which an inconvenience such as a break can be suppressed even if an electrode having a high aspect ratio is formed.

In view of this, the present inventors have found that a high performance electrode, which could not achieved by the electrode structure in the conventional art, by assigning contact performance with a substrate, low resistance property, and contraction resistance to respective layers in a multi-layered electrode structure by constituting an electrode of two or more layers in a multi-layered structure which is constituted of a first layer made of silver particles excellent in contact performance, formed directly on a solar cell substrate in order to maintain the contact performance with the semiconductor substrate, and second and subsequent layers made of sintered bodies including mainly silver particles having a high contraction resistance and glass frit.

The present inventors have conducted experiments and studies, resulting in optimization of various conditions so as to complete the present invention.

Hereinafter, the present invention will be more specifically described in reference to the drawings. Here, the present invention is not limited to this.

Figure 1:
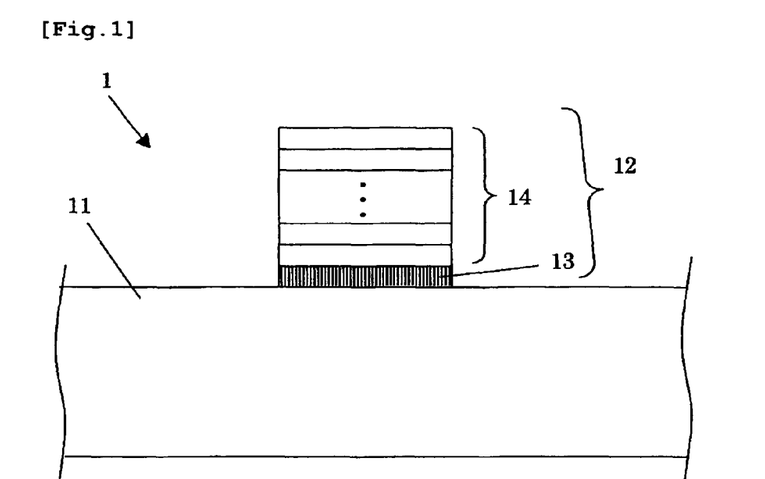
FIG. 1 is a schematically cross-sectional view showing a semiconductor substrate provided with an electrode according to the present invention.

FIG. 1 is a schematic view showing a semiconductor substrate 1 according to the present invention.

For example, an electrode 12 is formed on a raw substrate 11 such as a silicon single-crystal substrate. The electrode 12 has a multi-layered structure constituted of a first electrode layer 13 joined directly to the raw substrate 11 and an upper electrode layer 14 disposed on the first electrode layer and consisting of at least one layer. The electrode 12 is connected to a wiring, not shown, on the upper electrode layer 14.

Out of electrode layers constituting the electrode 12, the first electrode layer 13 contains at least silver and glass frit. In the meantime, the upper electrode layer 14 contains at least silver and glass frit, and obtained by firing a conductive paste having the total silver content of 75 wt % or more and 95 wt % or less, and further, the content of silver particles having an average particle diameter of 4 µm or greater and 8 µm or smaller with respect to the total silver content in the upper electrode layer is greater than that in the first electrode layer.

The average particle diameter herein refers to an SEM particle diameter obtained by calculating an average based on measurement of a diameter of a particle by SEM photography.

Incidentally, in the electrode 12, each of the content of the silver particle having an average particle diameter of 0.5 µm or greater and smaller than 4 µm with respect to the total silver content in the upper electrode layer 14 and the content of the silver particle having an average particle diameter of 4 µm or greater and 8 µm or smaller with respect to the total silver content in the upper electrode layer 14 should be preferably 20 wt % or more and 80 wt % or less. Furthermore, it is preferable that the content of the silver particle having an average particle diameter of smaller than 0.5 µm or greater than 8 µm with respect to the total silver content in the upper electrode layer 14 should be preferably 30 wt % or less.

The electrode in the semiconductor substrate according to the present invention such configured as described above is formed as follows.

After the raw substrate 11 is prepared, the first electrode layer 13 is first formed on the raw substrate 11. At this time, a thin oxide or nitride film may be formed on the raw substrate 11 for a reason described later. A conductive paste including at least silver powder, glass frit, an organic vehicle, and an organic solvent is applied onto the raw substrate 11, followed by heating at, for example, 150° C. to 200° C., and then, the organic solvent contained in the conductive paste is evaporated, thus forming the first electrode layer 13.

Here, the organic vehicle and the organic solvent to be normally used may be blended in the conductive paste for the first electrode layer, wherein the organic vehicle should preferably have a decomposition start temperature of higher than 250° C. for a reason described later.

A viscosity of the conductive paste for the first electrode layer should be preferably 80 Pa·s or more and 200 Pa·s or less or its thixotropy (a TI value) should be preferably 1.5 or more and 5.0 or less (5 rpm/50 rpm), thereby making printability more favorable. In this manner, a fine line can be printed on the first electrode layer. The viscosity herein is measured at a temperature of 25° C. in the case where a rotational speed of the Brookfield rotational viscometer (e.g., HB type SSA 15/6R) is set to 50 rpm. The thixotropy (the TI value) is represented by a ratio of the viscosities at rotational speeds of 5 rpm and 50 rpm at a temperature of 25° C. The above-described viscosity and thixotropy of the conductive paste are achieved by adjusting the type and content of the organic solvent or the organic vehicle.

At this time, in order to achieve the favorable printability of the conductive paste for the first electrode layer, the total silver content contained in the conductive paste for the first electrode layer should be desirably set to 75 wt % or more and 95 wt % or less. In this manner, the total silver content contained in the first electrode layer to be formed also becomes almost 75 wt % or more and 95 wt % or less.

Moreover, in order to enhance the contact performance between the first electrode layer and the semiconductor substrate, the content of silver particles having an average particle diameter of 0.5 µm or greater and smaller than 4 µm with respect to the total silver content in the conductive paste for the first electrode layer should be desirably set as relatively great as, for example, 80 wt % or more. In this manner, the content of silver particles having an average particle diameter of 0.5 µm or greater and smaller than 4 µm with respect to the total silver content contained in the first electrode layer to be formed also becomes almost 80 wt % or more.

Subsequently, the upper electrode layer 14 is formed on the first electrode layer 13, as described below. Specifically, the conductive paste including at least silver powder, glass frit, an organic vehicle, and an organic solvent and having the total silver content of 75 wt % or more and 95 wt % or less and the content of silver particles having an average particle diameter of 4 µm or greater and 8 µm or smaller with respect to the total silver content being more than that in the conductive paste for the first electrode layer is applied onto the first electrode layer 13, followed by heating at, for example, 150° C. to 200° C., whereby the organic solvent contained in the conductive paste is evaporated, thereby forming a first layer out of the upper electrode layer. This process is conducted once or more, thereby forming the upper electrode layer 14 in one layer or a plurality of layers.

Incidentally, in the electrode 12, each of the content of the silver particle having an average particle diameter of 0.5 μm or greater and smaller than 4 μm with respect to the total silver content in the upper electrode layer 14 and the content of the silver particle having an average particle diameter of 4 μm or greater and 8 μm or smaller with respect to the total silver content in the upper electrode layer 14 is 20 wt % or more and 80 wt % or less, and further, the content of the silver particle having an average particle diameter of smaller than 0.5 μm or greater than 8 μm with respect to the total silver content in the upper electrode layer 14 is 30 wt % or less. This can be substantially achieved by adjusting each of the content of the silver particle having an average particle diameter of 0.5 μm or greater and smaller than 4 μm with respect to the total silver content in the conductive paste for the upper electrode layer and the content of the silver particle having an average particle diameter of 4 μm or greater and 8 μm or smaller with respect to the total silver content in the conductive paste for the upper electrode layer to be 20 wt % or more and 80 wt % or less, and by adjusting the content of the silver particle having an average particle diameter of smaller than 0.5 μm or greater than 8 μm with respect to the total silver content in the conductive paste for the upper electrode layer to be 30 wt % or less.

Here, an organic vehicle and an organic solvent to be normally used may be blended in the conductive paste for the upper electrode layer, wherein an organic vehicle should preferably have a decomposition start temperature of 170° C. or higher and 250° C. or lower. As described above, the decomposition start temperature of the organic vehicle contained in the conductive paste for the first electrode layer is set to be higher than 250° C., and the decomposition start temperature of the organic vehicle contained in the conductive paste for the upper electrode layer is set to be lower than that of the conductive paste for the first electrode layer, thereby suppressing combustion gas from occluding so as to more effectively prevent incomplete combustion, foaming, cracking, or the like in firing and sintering the first electrode layer.

Furthermore, a viscosity of the conductive paste for the upper electrode layer should be preferably 80 Pa·s or more and 200 Pa·s or less or its thixotropy (a TI value) should be preferably 1.2 or more and 3.5 or less (5 rpm/50 rpm), thereby making superimposition printability favorable.

The layers in the electrode 12 are formed in the above-described manner, followed by firing at as high as, for example, 600° C. to 850° C. for, for example, 1 min. to 5 min. With this firing, the organic vehicle contained in the conductive paste of each of the layers is dissipated, and then, silver contained in each of the layers in the electrode is sintered, thereby forming the electrode 12. Heating for the above-described firing is carried out, so that even if the electrode 12 is formed on an oxide film as thin as 100 nm or less, the oxide film is simultaneously melted in heating for the firing, and then, the electrode breaks the oxide film to be joined directly to a semiconductor layer per se of the raw substrate 11 (this phenomenon is referred to as fire-through).

The electrodes formed on the semiconductor substrate are such configured as described above, thereby producing the following functions.

That is to say, the content of the silver particle having the average particle diameter of 4 μm or greater and 8 μm or smaller with respect to the total silver content in the upper electrode layer 14 is greater than the content of the silver particle having an average particle diameter of 4 μm or greater and 8 μm or smaller with respect to the total silver content in the first electrode layer 13, thereby enhancing the contraction resistance of the upper electrode layer, so as to enhance the contraction resistance of the entire electrode 12. This is because the relatively great silver particle having the average particle diameter of 4 μm or greater and 8 μm or smaller has a contraction range smaller than a smaller silver particle. With the electrode having the above-described high contraction resistance, it is possible to suppress the occurrence of an inconvenience such as a break more than in the electrode having the multi-layered structure in the conventional art.

The above-described electrode 12 is suitable for, in particular, a front surface electrode in a solar cell.

Figure 2:
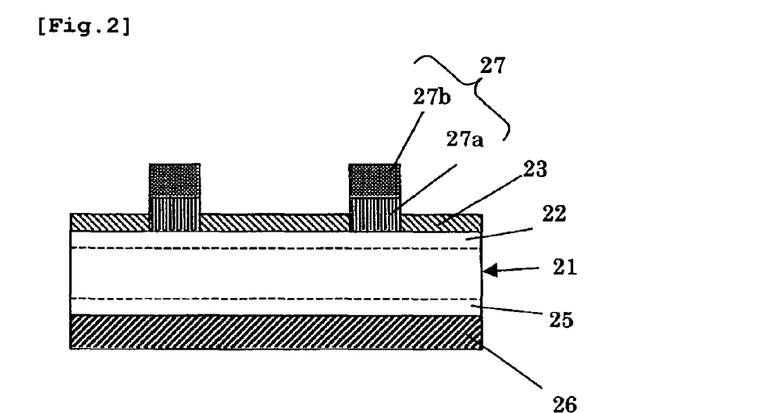
FIG. 2 is a schematically cross-sectional view showing the structure of a solar cell specifically exemplifying a semiconductor substrate provided with an electrode according to the present invention.

FIG. 2 is a schematic view exemplifying a solar cell according to the present invention. A structure is identical to that of a conventional solar cell except a front surface electrode, which may be configured as, for example, described below. In one main surface side of a p-type Si substrate 21 made of single-crystal or polycrystalline Si is formed an emitter layer (an $n^+$ layer) 22 having P or the like diffused therein in a depth of 0.1 μm to 0.5 μm, on which are formed an antireflection coating 23 made of $Si_3N_4$ or $SiO_2$ for reducing a surface reflectance and a front surface electrode (i.e., a light-receiving surface electrode) 27 for taking out a current. In the other surface side (i.e., a back surface side) of the Si substrate are formed a back surface electrode 26, and a BSF layer (a $p^+$ layer) 25 having Al or the like diffused therein at a high concentration, as required. Among these, the front surface electrode 27 includes a first electrode layer 27a and an upper electrode layer 27b. The first electrode layer 27a contains at least silver and glass frit, and the upper electrode layer 27b contains at least silver and glass frit. The total silver content contained in the upper electrode layer 27b is 75 wt % or more and 95 wt % or less. The content of the silver particles having an average particle diameter of 4 μm or greater and 8 μm or smaller with respect to the total silver content in the upper electrode layer 27b is higher than the content in the first electrode layer 27a.

FIG. 2 shows the front surface electrode 27 constituted of the two layers. Here, the electrode structure shown in FIG. 1 may be applied to the front surface electrode 27. Specifically, the upper electrode layer 27b may be constituted of two or more layers, so that the front surface electrode 27 may be constituted of three or more electrode layers. Otherwise, although the semiconductor substrate according to the present invention is used for the solar cell, the present invention is not limited to this. That is to say, the present invention may be applied to any semiconductor substrate having an electrode.

The above-described solar cell may be fabricated in the following manner, for example.

An as-cut single-crystal {100} p-type silicon substrate 21 doped with a III group element such as boron or gallium in high-purity silicon and having a resistivity of 0.1 Ω·cm to 5 Ω·cm and a thickness of about 0.1 mm to 1.0 mm is subjected to a slice damage removing treatment and texture (light confining unevenness) formation. The texture is readily produced by soaking the silicon substrate in an alkaline solution incorporating heated sodium hydroxide, potassium hydroxide, potassium carbonate, sodium carbonate, sodium acid carbonate, or the like (at a concentration of several % to several tens % and at a temperature of 60° C. to 100° C.) for about 10 min. to 30 min. A predetermined amount of 2-propanol is dissolved into the above-described solution in many cases, thereby promoting the reaction. In order to uniformly form the texture, it is preferable to use a solution incorporating several % of 2-propanol into a solution of sodium hydroxide or potassium hydroxide having a concentration of several % and being heated at a temperature of 60° C. to 70° C.

After the formation of the texture, the semiconductor substrate 21 is cleaned in an acidic solution composed of a hydrochloric acid, a sulfuric acid, a nitric acid, a fluoric acid, or a mixture thereof. From economic and efficient viewpoints, cleaning in a hydrochloric acid solution is preferred. In order to enhance cleanness, several % of hydrogen peroxide may be mixed into the hydrochloric acid solution, followed by heating at 60° C. to 90° C., to be thus used for the cleaning.

Next, the emitter layer 22 is formed by a vapor-phase diffusion method using phosphorus oxychloride. In order to prevent any diffusion to the back surface, it is preferable to arrange the layers in pairs on a diffusion board with the back surfaces thereof superimposed one on another, followed by vapor-phase diffusion. Specifically, heat treatment is carried out at 820° C. to 880° C. for several tens minutes in the atmosphere of phosphorus oxychloride, thereby forming an n-type layer on a light receiving surface. The emitter layer formed has a depth of 0.2 μm to 1.0 μm and a sheet resistance of 40Ω/□ to 150Ω/□. After the diffusion, phosphor glass formed by the diffusion is soaked in a solution of several % of a fluoric acid for several minutes, to be thus removed.

Thereafter, the antireflection coating 23 at the front surface is formed. The antireflection coating 23 is composed of a two-layered film made of cerium oxide, alumina, tin dioxide, titanium dioxide, magnesium fluoride, tantalum oxide, and a mixture of two kinds thereof in addition to silicon oxide or silicon nitride, wherein the use of any component raises no problem. The antireflection coating is formed by PVD, CVD, or the like, which may be used. In order to fabricate a solar cell of a high efficiency, the antireflection coating should be preferably formed with silicon nitride by remote plasma CVD since a low surface re-joint speed can be achieved.

Subsequently, the back surface electrode 26 is formed in 10 μm to 50 μm on the back surface. The back surface electrode 26 may be made of metal such as silver or copper, wherein Al is most preferable from viewpoints of economy, machinability, and contact performance to silicon. A metallic layer can be deposited by any of sputtering, vacuum deposition, and screen-printing. The metal for the electrode is uniformly deposited on the back surface. Here, it is desirable that Al should be diffused into the Si substrate at a joint to the Si substrate by firing an electrode including mainly Al by the screen printing, so that the back surface electric field region (i.e., the BSF layer; a high concentration $p^+$ region) 25 containing a great amount of a p-type impurity can be formed on the Si substrate.

Next, the front surface electrode 27 according to the present invention is formed as follows. The first electrode layer 27a is made of the conductive paste including mainly the silver powder, the glass frit, the organic vehicle, and the organic solvent. The upper electrode layer 27b is formed by applying, on the antireflection coating, the conductive paste having the total silver content of 75 wt % or more and 95 wt % or less and the content of silver particles having an average particle diameter of 4 μm or greater and 8 μm or smaller with respect to the total silver content being more than that in the conductive paste for the first electrode layer, followed by drying the organic solvent and firing it at, for example, 600° C. to 850° C. for 1 min. to 5 min. At this time, as described above, even if each of the layers on the front surface electrode 27 is formed on the antireflection coating, the antireflection coating is melted during the heating for the firing, so that the front surface electrode 27 breaks the antireflection coating to be then bonded in such a manner that the electrode is joined directly to the semiconductor layer per se of the semiconductor substrate 21. Incidentally, the front surface electrode 27 and the back surface electrode 26 may be formed in a reverse order.

EXAMPLES

The present invention will be specifically described by way of Examples and Comparative Examples according to the present invention, but the present invention is not limited to those.

Examples 1 to 10 and Comparative Examples 1 and 2

In each example, ten pieces of semiconductor substrates were subjected to the following process, thereby fabricating ten solar cells.

First of all, a semiconductor substrate was fabricated such that the back surface electrode 26 was formed by preparing a boron-doped {100} p-type as-cut silicon substrate 21 having a side of 15 cm, a thickness of 250 μm, and a resistivity of 2.0 Ω·cm; removing a damaged layer in a solution of concentrated potassium hydroxide; forming a texture; forming the emitter layer 22 heated at 850° C. in the atmosphere of phosphorus oxychloride; removing phosphor glass; forming the antireflection coating 23; screen-printing the paste including mainly aluminum on the entire back surface; and drying the organic solvent.

The front surface electrode 27 was formed on the semiconductor substrate through the process for forming the back surface electrode 26, as follows.

First of all, the conductive paste for the first electrode layer which mainly included the silver powder, the glass frit, the organic vehicle, and the organic solvent, in which the total silver content was 80 wt % and the contents of the silver particles having particle diameters of 0.5 μm or greater and smaller than 4 μm, 4 μm or greater and 8 μm or smaller, and smaller than 0.5 μm or greater than 8 μm, with respect to the total silver content were 90 wt %, 5 wt %, and 5 wt %, respectively, a viscosity was 120 Pa·s, and a thixotropy (a TI value) was 2.5 (that is, the same conductive paste as that used in Comparative Example 4, described later), was applied onto the antireflection coating formed on the semiconductor substrate by the screen-printing, followed by drying the organic solvent in a clean oven at 150° C., thus forming the first electrode layer 27a.

Next, the conductive pastes for the upper electrode layer which mainly included the silver powder, the glass frit, the organic vehicle, and the organic solvent, in which the total silver content, the content of the silver particles having particle diameters with respect to the total silver content in the conductive paste for the upper electrode layer, the viscosity, and the thixotropy (the TI value) were shown in Table 1 below, were applied onto the first electrode layer, followed by drying the organic solvent in a clean oven at 150° C., thus forming the upper electrode layer 27b. The semiconductor substrates having the above-described electrode layers formed thereon were heated for 5 min. in a near-infrared furnace at which a highest temperature was set to 750° C., followed by firing the entire electrode 27. Here, in Comparative Examples 1 and 2, the total silver content in the conductive paste for the upper electrode layer fell in 70 wt % and 97 wt %, respectively, which were beyond the range of 75 wt % or more to 95 wt % or less.

TABLE 1

| | ELECTRODE STRUCTURE | TOTAL SILVER CONTENT (wt %) IN CONDUCTIVE PASTE FOR UPPER ELECTRODE LAYER(S) | CONTENT (wt %) OF SILVER PARTICLES HAVING PARTICLE DIAMETERS WITH RESPECT TO TOTAL SILVER CONTENT IN UPPER ELECTRODE LAYER(S) | | | VISCOSITY (Pa · s) OF CONDUCTIVE PASTE FOR UPPER ELECTRODE LAYER(S) (25° C., 50 rpm) | TI VALUE OF CONDUCTIVE PASTE FOR UPPER ELECTRODE LAYER(S) (5 rpm/50 rpm) |
|---|---|---|---|---|---|---|---|
| | | | 0.5 μm OR GREATER AND SMALLER THAN 4 μm | 4 μm OR GREATER AND 8 μm OR SMALLER | SMALLER THAN 0.5 μm OR GREATER THAN 8 μm | | |
| EXAMPLE 1 | TWO LAYERS | 85 | 20 | 80 | 0 | 110 | 2.2 |
| EXAMPLE 2 | TWO LAYERS | 85 | 30 | 70 | 0 | 120 | 2.1 |
| EXAMPLE 3 | TWO LAYERS | 85 | 50 | 50 | 0 | 140 | 1.9 |
| EXAMPLE 4 | TWO LAYERS | 85 | 70 | 30 | 0 | 170 | 2.0 |
| EXAMPLE 5 | TWO LAYERS | 85 | 80 | 20 | 0 | 190 | 2.0 |
| EXAMPLE 6 | TWO LAYERS | 75 | 20 | 80 | 0 | 95 | 2.2 |
| EXAMPLE 7 | TWO LAYERS | 95 | 20 | 80 | 0 | 200 | 3.0 |
| EXAMPLE 8 | TWO LAYERS | 90 | 20 | 65 | 15 | 150 | 1.8 |
| EXAMPLE 9 | TWO LAYERS | 90 | 15 | 55 | 30 | 160 | 1.9 |
| EXAMPLE 10 | TWO LAYERS | 90 | 20 | 40 | 40 | 140 | 2.1 |
| EXAMPLE 11 | THREE LAYERS | 85 | 20 | 80 | 0 | 110 | 2.2 |
| COMPARATIVE EXAMPLE 1 | TWO LAYERS | 70 | 20 | 80 | 0 | 100 | 2.4 |
| COMPARATIVE EXAMPLE 2 | TWO LAYERS | 97 | 20 | 80 | 0 | 350 | 3.5< |

Characteristics evaluation was made on the ten solar cells fabricated in the above-described manner.

The characteristics evaluation was made by electricity measurement (a short-circuit current, a density, an open-circuit voltage, a fill factor, and conversion efficiency) under a solar simulator (irradiation intensity: 1 kW/m$^2$; spectrum: AM 1.5 global) at a temperature atmosphere of 25° C.

Example 11

Ten pieces of semiconductor substrates were fabricated in the same process as in Example 1 except that there were two upper electrode layers, that is, the entire front surface electrode was constituted of three layers.

First of all, the first electrode layer was fabricated in the same manner as in Example 1. Next, the conductive pastes for the upper electrode layer mainly including the silver powder, the glass frit, the organic vehicle, and the organic solvent, in which the total silver content, the content of the silver particles having particle diameters with respect to the total silver content in the conductive paste for the upper electrode layer, the viscosity, and the thixotropy (a TI value) were shown in Table 1, were applied onto the first electrode layer, followed by drying the organic solvent in a clean oven at 150° C., thus forming the first layer in the upper electrode layer. Subsequently, the same conductive paste as that used in forming the first layer in the upper electrode layer was applied onto the first layer in the upper electrode layer, followed by drying the organic solvent in the clean oven at 150° C., thus forming a second layer in the upper electrode layer.

The semiconductor substrate having the above-described electrode layers formed thereon was heated for 5 min. in a near-infrared furnace at which a highest temperature was set to 750° C., followed by firing the entire electrode.

Characteristics evaluation was made on the ten solar cells fabricated as described above in the same manner as in Example 1.

Comparative Examples 3 and 4

In each example, ten pieces of semiconductor substrates were fabricated in which the processes up to the formation of the back surface electrode 26 were identical to those in Example 1 and the front surface electrode was formed only once in the single layer structure shown in FIG. 3, as described below.

The front surface electrode 34 was formed as follows. The conductive pastes mainly including the silver powder, the glass frit, the organic vehicle, and the organic solvent, in which the total silver content, the content of the silver particles having the particle diameters with respect to the total silver content in the conductive paste for the electrode layer, the viscosity, and the thixotropy were shown in Table 2 below, were applied onto the semiconductor substrate, followed by drying the organic solvent in the clean oven at 150° C., thus forming the electrode. The semiconductor substrates having the above-described electrode layers formed thereon were heated for 5 min. in a near-infrared furnace at which a highest temperature was set to 750° C., firing the front surface electrode 34.

Characteristics evaluation was made on the ten solar cells fabricated as described above in the same manner as in Example 1.

Comparative Examples 5 and 6

In each example, ten pieces of semiconductor substrates were fabricated in which the processes up to the formation of the back surface electrode 26 were identical to those in Example 1 and the front surface electrode was formed in the same manner as in Example 1 except that the conductive pastes for the first and upper electrode layers had the same composition. Here, the conductive pastes listed in Table 2 were used as the conductive pastes for the first and upper electrode layers.

Characteristics evaluation was made on the ten solar cells fabricated as described above in the same manner as in Example 1.

the silver particles having an average particle diameter of 4 μm or greater and 8 μm or smaller which were high in contraction resistance induced a break or an insufficient electrode height due to the contraction of the silver particle, thereby decreasing a fill factor.

In contrast, in Comparative Examples 1 to 6, the fill factors mainly were decreased, and therefore, the conversion efficiencies were lower than those in Examples.

In Comparative Example 1, the total silver content in the conductive paste for the upper electrode layer was lower than

TABLE 2

| | ELECTRODE STRUCTURE | TOTAL SILVER CONTENT (wt %) IN CONDUCTIVE PASTE FOR EACH ELECTRODE LAYER | CONTENT (wt %) OF SILVER PARTICLES HAVING PARTICLE DIAMETERS WITH RESPECT TO TOTAL SILVER CONTENT IN EACH OF ELECTRODE LAYER(S) | | | VISCOSITY (Pa·s) OF CONDUCTIVE PASTE FOR EACH OF ELECTRODE LAYER(S) (25° C., 50 rpm) | TI VALUE OF CONDUCTIVE PASTE FOR EACH OF ELECTRODE LAYER(S) (5 rpm/50 rpm) |
|---|---|---|---|---|---|---|---|
| | | | 0.5 μm OR GREATER AND SMALLER THAN 4 μm | 4 μm OR GREATER AND 8 μm OR SMALLER | SMALLER THAN 0.5 μm OR GREATER THAN 8 μm | | |
| COMPARATIVE EXAMPLE 3 | SINGLE LAYER | 85 | 20 | 80 | 0 | 110 | 2.2 |
| COMPARATIVE EXAMPLE 4 | SINGLE LAYER | 80 | 90 | 5 | 5 | 120 | 2.5 |
| COMPARATIVE EXAMPLE 5 | TWO LAYERS | 85 | 20 | 80 | 0 | 110 | 2.2 |
| COMPARATIVE EXAMPLE 6 | TWO LAYERS | 80 | 90 | 5 | 5 | 120 | 2.5 |

Results of Examples 1 to 11 and Comparative Examples 1 to 6 are shown in Table 3. Here, Table 3 shows measurement averages of electric characteristics of the ten solar cells.

TABLE 3

| | SHORT CIRCUIT CURRENT (mA/cm$^2$) | OPEN CIRCUIT VOLTAGE (mV) | FILL FACTOR (%) | CONVERSION EFFICIENCY (%) |
|---|---|---|---|---|
| EXAMPLE 1 | 35.1 | 620 | 78.3 | 17.0 |
| EXAMPLE 2 | 35.0 | 621 | 77.9 | 16.9 |
| EXAMPLE 3 | 34.9 | 619 | 77.5 | 16.7 |
| EXAMPLE 4 | 35.2 | 620 | 77.1 | 16.8 |
| EXAMPLE 5 | 35.3 | 619 | 76.9 | 16.8 |
| EXAMPLE 6 | 34.8 | 622 | 77.5 | 16.8 |
| EXAMPLE 7 | 35.1 | 618 | 78.5 | 17.0 |
| EXAMPLE 8 | 35.4 | 622 | 78.0 | 17.2 |
| EXAMPLE 9 | 35.2 | 620 | 77.8 | 17.0 |
| EXAMPLE 10 | 34.8 | 619 | 73.7 | 15.9 |
| EXAMPLE 11 | 34.8 | 618 | 78.9 | 17.0 |
| COMPARATIVE EXAMPLE 1 | 34.7 | 619 | 73.1 | 15.7 |
| COMPARATIVE EXAMPLE 2 | 33.1 | 615 | 51.5 | 10.5 |
| COMPARATIVE EXAMPLE 3 | 35.0 | 618 | 65.2 | 14.1 |
| COMPARATIVE EXAMPLE 4 | 35.2 | 620 | 72.9 | 15.8 |
| COMPARATIVE EXAMPLE 5 | 34.0 | 615 | 65.2 | 13.6 |
| COMPARATIVE EXAMPLE 6 | 33.0 | 610 | 49.3 | 10.0 |

From Table 3 are found the followings.

The solar cells having high efficiencies were obtained in each of Examples 1 to 11. Here, the content of the silver particles having an average particle diameter of smaller than 0.5 μm or greater than 8 μm with respect to the total silver content in the upper electrode layer was as relatively great as 40 wt % and the conversion efficiency was slightly low in Example 10. It appears that this is because the low content of the value according to the present invention, thereby inducing a break or an insufficient electrode height due to the contraction of the silver particle. It appears that, as a result of this, a series resistance of the solar cell was increased, and therefore, the efficiency was degraded due to the decrease in the fill factor.

In Comparative Example 2, the total silver content in the conductive paste for the upper electrode layer was higher than the value according to the present invention, thereby extremely deteriorating printability, so that the upper electrode layer could not be satisfactorily formed. It appears that, as a result of this, a series resistance of the solar cell was increased, and therefore, the efficiency was degraded due to the decrease in the fill factor.

In Comparative Example 3, the single electrode structure was provided by using the conductive paste which was used as the conductive paste for the upper electrode layer in Example 1. It appears that an area in contact with the substrate was reduced by the influence of the silver particle having a relatively large size like an average particle diameter of 4 μm or greater and 8 μm or smaller, thereby increasing the series resistance of the solar cell, and therefore, the efficiency was degraded due to the decrease in the fill factor.

In Comparative Example 4, the single electrode structure was provided by using the conductive paste which was used as the conductive paste for the first electrode layer in Examples 1 to 11. Ohmic contact characteristic was favorable, but the electrode height was insufficient. It appears that, as a result of this, increasing the series resistance of the solar cell, and therefore, the efficiency was degraded due to the decrease in the fill factor.

In Comparative Example 5, the conductive paste which was used as the conductive paste for the upper electrode layer in Example 1 was used as both of the first electrode layer and the upper electrode layer. Although the electrode height was sufficient, an area in contact with the substrate was reduced by the influence of the silver particle having a relatively large size like an average particle diameter of 4 μm or greater and 8 μm or smaller, like in Comparative Example 3, thereby increasing the series resistance of the solar cell, and therefore, the conversion efficiency was degraded due to the decrease in the fill factor.

In Comparative Example 6, the conductive paste which was used as the conductive paste for the first electrode layer in Examples 1 to 11 was used as both of the first electrode layer and the upper electrode layer. During the firing and the sintering, foaming, cracking, incomplete combustion of the conductive paste for the first electrode layer, or the like was occurred, and the contraction of the electrode induced a break. It appears that, thereby, the series resistance of the solar cell increased. Therefore, the conversion efficiency was degraded due to the decrease in the fill factor.

As a consequence, the solar cells obtained in Examples 1 to 11, in particular, Examples 1 to 9 and 11 exhibited favorable electric characteristics, whereby the effects according to the present invention were substantiated.

Incidentally, the present invention is not limited to the above-described preferred embodiments. The above-described preferred embodiments are merely illustrative. Any having features substantially identical to that of the technical idea claimed according to the present invention and functions and effects similar to those according to the present invention are encompassed within the technical scope according to the present invention.

The invention claimed is:

1. A solar cell fabricating method comprising at least:
forming an antireflection coating at a front surface of a semiconductor substrate having a pn junction;
forming a front surface electrode at the antireflection coating; and
forming a back surface electrode on a back surface of the semiconductor substrate;
wherein at least the front surface electrode is formed by an electrode forming method for an electrode having a multi-layered structure on a semiconductor substrate by screen-printing by using a conductive paste including at least silver powder, glass frit, an organic vehicle, and an organic solvent, comprising:
forming a first electrode layer joined directly to the semiconductor substrate; and
forming an upper electrode layer constituted of at least one layer on the first electrode layer;
wherein the conductive paste for the upper electrode layer, for forming the upper electrode layer, has a total silver content of 75 wt % or more and 95 wt % or less, and a content of silver particles having an average particle diameter of 4 or greater and 8 μm or smaller with respect to the total silver content in the conductive paste for the upper electrode layer is higher than that in the conductive paste for the first electrode layer; and
the upper electrode layer has a same footprint as the first electrode layer.

2. A solar cell fabricating method comprising at least:
forming an antireflection coating at a front surface of a semiconductor substrate having a pn junction;
forming a front surface electrode at the antireflection coating; and
forming a back surface electrode on a back surface of the semiconductor substrate;
wherein at least the front surface electrode is formed by an electrode forming method for an electrode having a multi-layered structure on a semiconductor substrate by screen-printing by using a conductive paste including at least silver powder, glass frit, an organic vehicle, and an organic solvent, comprising:
forming a first electrode layer joined directly to the semiconductor substrate; and
forming an upper electrode layer constituted of at least one layer on the first electrode layer;
wherein the conductive paste for the upper electrode layer, for forming the upper electrode layer, has a total silver content of 75 wt % or more and 95 wt % or less, and a content of silver particles having an average particle diameter of 4 μm or greater and 8 μm or smaller with respect to the total silver content in the conductive paste for the upper electrode layer is higher than that in the conductive paste for the first electrode layer; and
the upper electrode layer has a same footprint as the first electrode layer; wherein
a content of the silver particles having an average particle diameter of 0.5 μm or greater and smaller than 4 μm with respect to the total silver content in the conductive paste for the upper electrode layer and the content of the silver particles having an average particle diameter of 4 μm or greater and 8 μm or smaller with respect to the total silver content in the conductive paste for the upper electrode layer is 20 wt % or more and 80 wt % or less;
a content of the silver particles having average particle diameter of smaller than 0.5 μm or greater than 8 μm with respect to the total silver content in the conductive paste for the upper electrode layer is 30 wt % or less;
a content of the silver particles having an average particle diameter of 0.5 μm or greater and smaller than 4 μm with respect to the total silver content in the conductive paste for the first electrode layer is 80 wt % or more;
the organic vehicle contained in the conductive paste for the first electrode layer has a decomposition start temperature of higher than 250° C., and the organic vehicle contained in the conductive paste for the upper electrode layer has a decomposition start temperature of 170° C. or higher and 250° C. or lower;
a viscosity of each of the conductive pastes for the first electrode layer and the upper electrode layer is 80 Pa·s or more and 200 Pa·s or less; and
the conductive paste for the first electrode layer has a thixotropy of 1.5 or more and 5.0 or less at 5 rpm/50 rpm, and the conductive paste for the upper electrode layer has a thixotropy of 1.2 or more and 3.5 or less at 5 rpm/50 rpm.

* * * * *